United States Patent [19]

Fujii et al.

[11] Patent Number: 5,406,445
[45] Date of Patent: Apr. 11, 1995

[54] THIN FILM CAPACITOR AND METHOD OF MANUFACTURING THE SAME

[75] Inventors: Eiji Fujii, Kyoto; Atsushi Tomozawa, Osaka; Hideo Torii, Osaka; Masumi Hattori, Osaka; Ryoichi Takayama, Osaka; Satoru Fujii, Osaka, all of Japan

[73] Assignee: Matsushita Electric Industrial Co., Ltd., Osaka, Japan

[21] Appl. No.: 216,966

[22] Filed: Mar. 24, 1994

[30] Foreign Application Priority Data

Mar. 25, 1993 [JP] Japan .................................. 5-066317

[51] Int. Cl.⁶ ...................... H01L 29/04; H01L 23/48
[52] U.S. Cl. .................. 361/305; 361/321.5; 257/295
[58] Field of Search ............... 361/304, 305, 321.4, 361/321.5; 365/145, 149; 257/295, 296, 751-753, 298, 300

[56] References Cited

U.S. PATENT DOCUMENTS

| | | | |
|---|---|---|---|
| 5,006,363 | 4/1991 | Fujii et al. | 427/39 |
| 5,142,437 | 8/1992 | Kammerdiner | 361/313 |
| 5,212,620 | 5/1993 | Evans, Jr. | 361/313 |
| 5,323,023 | 6/1994 | Fork | 505/235 |
| 5,331,187 | 7/1994 | Ogawa | 257/295 |

FOREIGN PATENT DOCUMENTS 63-237514  10/1988  Japan .
4-184911    7/1992  Japan .

OTHER PUBLICATIONS

K. Iijima et al., "Preparation of c-axis oriented PbTiO₃ thin films and their crystallographic, . . . ," J. Appl. Phys. 60(1), 1 Jul. 1986, pp. 361-367.

M. Okada et al., "Preparation of c–Axis-Oriented PbTiO₃ Thin Films by MOCVD under Reduced Pressure", J. Journal of Appl. Phys., vol. 28, No. 6, (Jun., 1989), pp. 1030–1034.

B. S. Kwak et al., "Metalorganic chemical vapor deposition of BaTiO₃ thin films", J. Appl. Phys. 69(2), 15 Jan. 1991, pp. 767–772.

*Primary Examiner*—Bruce A. Reynolds
*Assistant Examiner*—Michael D. Switzer
*Attorney, Agent, or Firm*—Fish & Richardson

[57] ABSTRACT

A NaCl oxide thin layer oriented to (100) face or a spinel oxide thin layer oriented to (100) face, a perovskite dielectric thin layer oriented to (100) face and a metal electrode are sequentially laminated on a metal electrode, thus providing a thin film capacitor. Or alternatively, a thin film capacitor is manufactured by sequentially laminating a NaCl oxide thin layer oriented to (100) face or a spinel oxide thin layer oriented to (100) face, a platinum thin layer as a lower electrode oriented to (100) face, a perovskite dielectric thin layer oriented to (100) face and a metal thin layer as an upper electrode on a substrate. A plasma-enhanced CVD method is applied to form a NaCl oxide thin layer, a spinel oxide thin layer and a perovskite dielectric thin layer while a vacuum deposition method, a sputtering method, a CVD method or a plasma-enhanced CVD method is applied for the formation of a metal electrode.

14 Claims, 7 Drawing Sheets

THIN FILM CAPACITOR AND METHOD OF MANUFACTURING THE SAME

FIELD OF THE INVENTION

The invention relates to a thin film capacitor and a method of manufacturing the same.

BACKGROUND OF THE INVENTION

Barium titanate ($BaTiO_3$) ceramics having a perovskite crystal structure have been widely used as capacitor materials and the like, since they have high resistivities and superior dielectric properties. Strontium titanate ($SrTiO_3$) becomes cubical at about a temperature higher than 110K, and is paraelectric. Ceramics mainly made from strontium titanate have lower dielectric constants than do the barium titanate ceramics. However, the strontium titanate ceramics have better temperature characteristics and less dielectric loss than do the barium titanate ceramics.

The curie points of ceramics can be shifted by employing an additive such as barium, lead or the like, thus providing paraelectric ceramics with a high dielectric constant at room temperature. These ceramics have been widely used for high frequency range and high voltage capacitors. Because complex perovskite compounds such as $Pb(Mg_{\frac{1}{3}}, Nb_{\frac{2}{3}})O_3$ and $Pb\{(Mg_{\frac{1}{3}}, Nb_{\frac{2}{3}})_{1-Y}Ti_Y\}O_3$ have higher dielectric constants and better direct current biases than do barium titanate dielectrics, they are used for small multilayer capacitors with high capacitance and the like.

As the demand for small, lightweight electronic components and highly integrated semiconductor devices increases, research in forming thin films of oxide materials having a perovskite structure and large dielectric constants such as barium titanate dielectric materials, strontium titanate dielectric materials, $Pb\{(Mg_{\frac{1}{3}}, Nb_{\frac{2}{3}})_{1-Y}Ti_Y\}O_3$ dielectric materials and the like has been actively carried out in order to manufacture small high-volume capacitors.

As a method of forming thin layers, a sputtering method has been conventionally applied. (For example, the method is disclosed in K. Iijima et al., J. Appl. Phys., vol. 60, No. 1, pp.361–367 (1986).) However, this method is slow in forming layers (<10 nm/min), requires expensive monocrystal substrates such as MgO and is poor in controlling the compositions of layers.

A sol-gel method, which has been intensively researched recently, on the other hand, is excellent in controlling the compositions of layers and suitable for forming multicomponent thin layers. However, this method provides layers with poor quality and coverage over uneven surfaces so that it cannot be applied as an industrial manufacturing technique.

A CVD (chemical vapor deposition) method is excellent in controlling the compositions of layers, and can form layers on substrates having large surface areas. The method also has a good property of covering uneven surfaces. Therefore, this method can be applied as a method of forming perovskite dielectric thin layers. (See M. Okada et al., Jpn. J. Appl. Phys., vol. 28, No. 6, pp. 1030–1034 (1989).) Compared with the sputtering method, the CVD method can form layers at high speed. However, the speed of forming a dielectric thin layer by the CVD method is still about 3 $\mu$m/h. For instance, in order to form a 2 $\mu$m thick dielectric layer (for example, $BaTiO_3$), the method takes about 40 minutes. (See B.S. Kwak et al., J. Appl. Phys., vol. 69, No. 2, pp. 767–772 (1991).)

Layers should be formed at a higher speed so that a thin film capacitor can be manufactured at lower cost. When a dielectric thin layer is directly formed on a metal electrode substrate or a metal thin layer by a sputtering method or a CVD method, a layer with poor crystallinities (initial growth layer) is formed in the early stages of film growth. Due to the formation of the initial growth layer, the electric characteristics of the thin film capacitor are lowered as the capacity of the capacitor is increased by thinning the dielectric thin layer.

On the other hand, a plasma-enhanced CVD method making use of plasma activity and CVD reaction can form layers at low temperature and high speed by dissolving and enhancing source materials with an active plasma. (For instance, see E. Fujii et al., Jpn. J. Appl. Phys., vol. 32, No. 10B, pp. 1527–1529 (1993) and A. Tomozawa et al., Journal of Magnetic Society of Japan, vol. 17, No. 2, pp. 319–322 (1993).) However, like the sputtering method and the CVD method, the plasma-enhanced CVD method forms a layer with poor crystallinity (initial growth layer) in the early stages of film growth when a dielectric layer is directly formed on a metal electrode substrate or a metal thin layer.

SUMMARY OF THE INVENTION

An object of the invention is to provide a small thin film capacitor with high capacitance and to provide a method of manufacturing the same.

In order to accomplish these and other objects and advantages, the thin film capacitor of the invention comprises:

a lower electrode directly or indirectly formed on a metal substrate (electrode) or a nonelectrode substrate;

a dielectric thin layer directly or indirectly formed on the surface of the lower electrode; and an upper electrode formed on the dielectric thin layer.

The indirect formation of a lower electrode on a substrate, or a dielectric thin layer on the lower electrode is due to the formation of at least one intervening oxide thin layer in between; conversely, direct formation allows for no intervening layers.

The dielectric thin layer is a perovskite dielectric thin layer oriented to (100) face. Anywhere below the dielectric thin layer, at least one layer selected from the group consisting of an NaCl oxide thin layer oriented to (100) face and a spinel oxide thin layer oriented to (100) face may additionally be formed.

The orientations of the perovskite dielectric thin layer, the NaCl oxide thin layer and the spinel oxide thin layer to (100) face refer to the growth of the (100) face of a perovskite, NaCl and spinel crystal structure in a parallel orientation to the substrate surface.

It is preferable in this composition that at least one layer selected from the group consisting of the NaCl oxide thin layer oriented to (100) face and the spinel oxide thin layer oriented to (100) face is formed between the lower electrode and the perovskite dielectric thin layer.

It is also preferable in this composition that the perovskite dielectric thin layer is $(Ba_{1-X}Sr_X)TiO_3$ ($0 \leq X \leq 1.0$) or $Pb\{(Mg_{\frac{1}{3}}, Nb_{\frac{2}{3}})_{1-Y}Ti_Y\}O_3$ ($0 \leq Y \leq 1.0$).

It is further preferable in this composition that the NaCl oxide thin layer is at least one layer selected from the group consisting of a magnesium oxide thin layer, a cobalt oxide thin layer and a nickel oxide thin layer.

It is preferable in this composition that the spinel oxide thin layer is an oxide thin layer mainly comprising at least one element selected from the group consisting of iron, cobalt and aluminum.

It is also preferable in this composition that the thin film capacitor has the lower electrode directly formed on the nonelectrode substrate, the NaCl oxide thin layer oriented to (100) face on the lower electrode, the perovskite dielectric thin layer oriented to (100) face on the NaCl oxide thin layer, and the upper electrode on the perovskite dielectric thin layer.

It is preferable in this composition that the thin film capacitor has the lower electrode directly formed on the nonelectrode substrate, the spinel oxide thin layer oriented to (100) face on the lower electrode, the NaCl oxide thin layer oriented to (100) face on the spinel oxide thin layer, the perovskite dielectric thin layer oriented to (100) face on the NaCl oxide thin layer, and the upper electrode on the perovskite dielectric thin layer.

It is preferable in this composition that the thin film capacitor has the NaCl oxide thin layer oriented to (100) face on the nonelectrode substrate, the lower electrode on the NaCl oxide thin layer, the perovskite dielectric thin layer on the lower electrode, and the upper electrode on the perovskite dielectric thin layer.

It is also preferable in this composition that the thin film capacitor has the spinel oxide thin layer oriented to (100) face on the nonelectrode substrate, the lower electrode on the spinel oxide thin layer the perovskite dielectric thin layer on the lower electrode, and the upper electrode on the perovskite dielectric thin layer.

A method of manufacturing the thin film capacitor of the invention comprises the steps of:

forming a lower electrode directly or indirectly on a metal substrate (electrode) or a nonelectrode substrate by at least one method selected from the group consisting of a sputtering method, a vacuum deposition method, a CVD method and a plasma-enhanced CVD method;

forming a dielectric thin layer directly or indirectly on the lower electrode; and forming an upper electrode on the dielectric thin layer by at least one method selected from the group consisting of a sputtering method, a vacuum deposition method, a CVD method and a plasma-enhanced CVD method.

At least one layer selected from the group consisting of a NaCl oxide thin layer oriented to (100) face and a spinel oxide thin layer oriented to (100) face is formed on the top or the bottom surface of the lower electrode by a plasma-enhanced CVD method. A perovskite dielectric thin layer oriented to (100) face is formed below the upper electrode by a plasma-enhanced CVD method.

It is preferable in this method that at least one layer selected from the group consisting of the NaCl oxide thin layer oriented to (100) face and the spinel oxide thin layer oriented to (100) face is formed on the lower electrode by a plasma-enhanced CVD method, and that the perovskite dielectric thin layer is formed on the NaCl oxide thin layer or the spinel oxide thin layer.

It is also preferable in this method that the perovskite dielectric thin layer is $(Ba_{1-X}Sr_X)TiO_3$ ($0 \leq X \leq 1.0$) or $Pb\{(Mg_{\frac{1}{3}}, Nb_{\frac{2}{3}})_{1-Y}Ti_Y\}O_3$ ($0 \leq Y \leq 1.0$).

It is preferable in this method that the NaCl oxide thin layer is at least one layer selected from the group consisting of a magnesium oxide thin layer, a cobalt oxide thin layer and a nickel oxide thin layer.

It is preferable in this method that the spinel oxide thin layer is an oxide thin layer mainly comprising at least one material selected from the group consisting of iron, cobalt and aluminum.

The reduction of electric characteristics due to the presence of the initial growth layer in the early stages of film growth can be significantly prevented in this invention. A dielectric thin layer with good crystallinity can be formed at the early stages of film growth since the crystallinity of the layer is influenced by the crystal arrangements of a lower platinum layer oriented to (100) face, which is formed on the top or the bottom surface of a NaCl oxide thin layer oriented to (100) face or a spinel oxide thin layer oriented to (100) face. By using a plasma-enhanced CVD method, the oriented NaCl oxide thin layer or spinel oxide thin layer can be formed, regardless of the kinds of substrates. Therefore, it is not necessary to use an expensive monocrystal substrate in the invention. Since the invention applies a plasma-enhanced CVD method instead of a sputtering method or a CVD method to form a dielectric thin layer, the invention can significantly reduce the time and cost of forming a layer.

It is preferable in this method that the thickness of the perovskite dielectric thin layer is 0.1—3 μm, and that the thickness of the NaCl oxide thin layer and the spinel oxide thin layer is 20 nm-3 μm.

DETAILED DESCRIPTION OF THE INVENTION

The invention will be explained specifically with reference to the following illustrative embodiments.

Example 1

Figure 1:
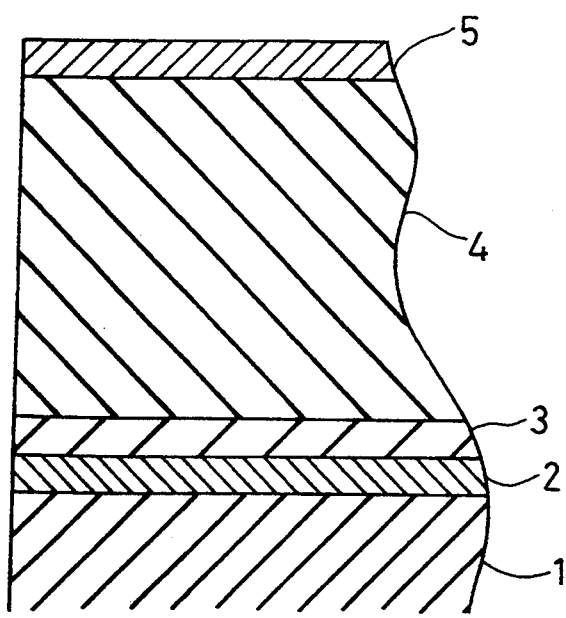
FIG. 1 shows a cross-sectional view of a thin film capacitor of one embodiment of the invention.

FIG. 1 shows a thin film capacitor having a platinum layer 2 (metal electrode) on a Si substrate 1, a NiO layer 3 (NaCl oxide thin layer oriented to (100) face) on platinum layer 2, $Ba_{0.7}Sr_{0.3}TiO_3$ layer 4 (perovskite dielectric thin layer oriented to (100) face) on NiO layer 3 and a platinum layer 5 (metal electrode) on $Ba_{0.7}Sr_{0.3}TiO_3$ layer 4.

Figure 2:
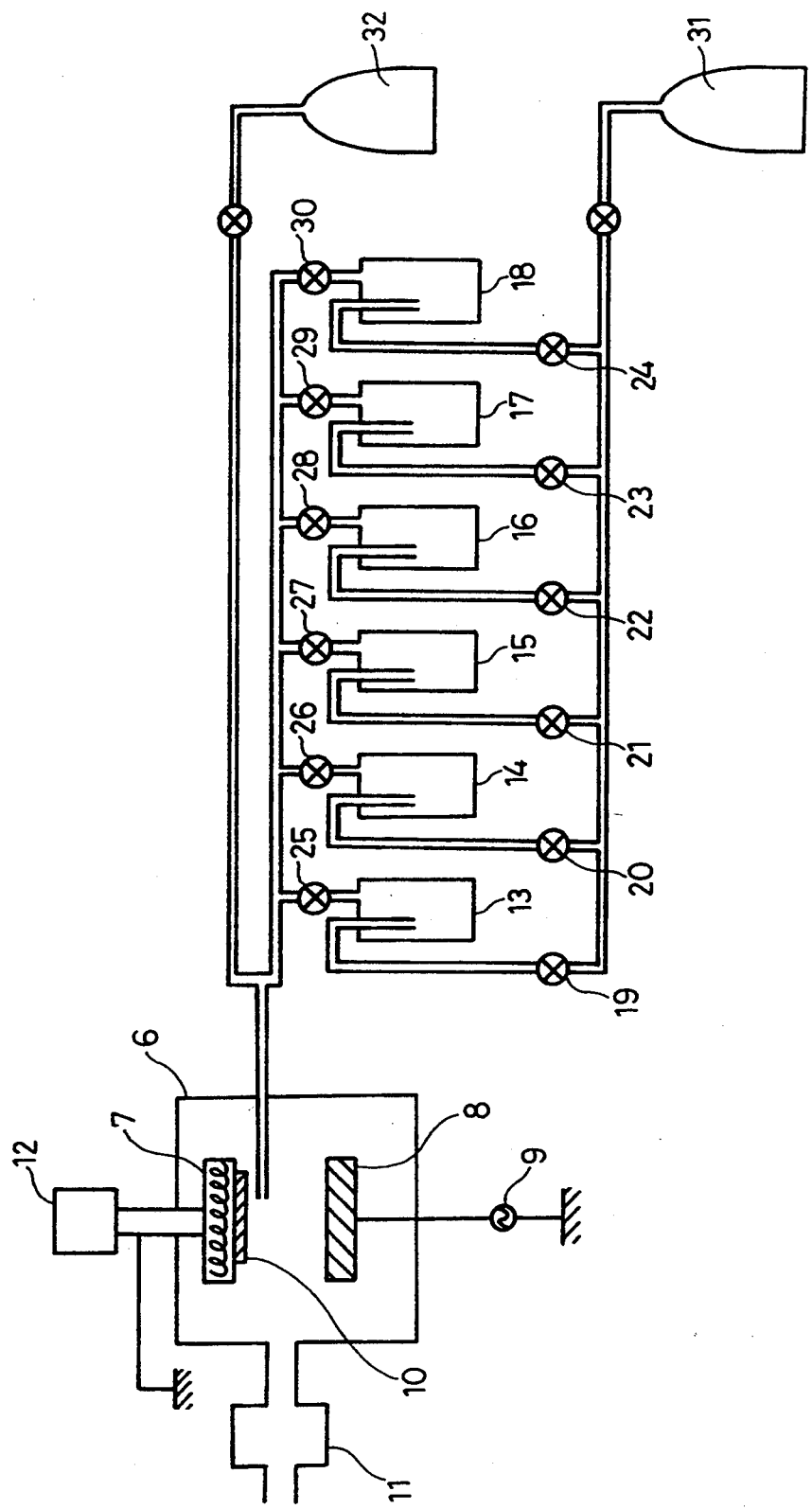
FIG. 2 shows a schematic side view of a plasma-enhanced CVD apparatus of one embodiment of the invention.

Inside a reaction chamber 6 shown in FIG. 2, an electrode 7 with a built-in substrate heater, to which a substrate rotating mechanism 12 is attached, is set opposite an electrode 8 to where a high frequency power source (of 13.56 MHz) 9 is connected. A substrate 10, which is Si substrate 1 formed with platinum layer 2

(metal electrode) on the surface, is attached to the bottom of electrode 7. An exhaust system 11 is fixed to one side of reaction chamber 6 to keep the chamber at low pressure.

Carburetors 13–18 containing materials of this example are connected to an argon bomb 31 containing carrier gas through valves 19–24. By opening and closing valves 25–30, the introduction of the gas along with carrier gas into reaction chamber 6 can be controlled. An oxygen bomb 32 is connected to a pipe which has its open end between electrode 8 and substrate 10.

More specifically, the thin film capacitor of this example was manufactured as follows.

A 100 nm thick Pt layer was formed on the Si substrate by a sputtering treatment with a rf magnetron sputtering apparatus at 50 W plasma power, 600° C. substrate temperature and 1.4 Pa gas pressure for 14 minutes. The Si substrate formed with the Pt layer (Pt layer/Si substrate) was attached to the bottom of electrode 7 shown in FIG. 2, and heated to 600° C. An NaCl oxide thin layer and a perovskite dielectric thin layer were then formed on the surface of the Pt layer as follows:

- inserting dehydrated nickel acetyl acetate, {Ni(acac)$_2'$, H$_2$O, acac=C$_5$H$_7$O$_2$}, into carburetor 17 and heating it to 160°C.;
- inserting barium dipivaloylmethane, {Ba(DPM)$_2$, DPM=C$_{11}$H$_{19}$O$_2$}, into carburetor 13 and heating it to 235° C.;
- inserting strontium dipivaloylmethane, {Sr(DPM)$_2$}, into carburetor 14 and heating it to 240° C.;
- inserting titanium tetraisopropoxy, {Ti(C$_3$H$_7$O)$_4$}, into carburetor 15 and heating it to 40° C.;
- opening valves 23 and 29 to introduce vaporized nickel acetyl acetate along with argon carrier gas at a 20 SCCM (standard cubic centimeters per minute) flow rate and oxygen at a 10 SCCM flow rate to reaction chamber 6 depressurized with exhaust system 11;
- generating a reaction at 5 Pa with 1.4 W/cm$^2$ electric power plasma for one minute in reaction chamber 6, thereby forming a 20 nm thick NiO layer on the surface of substrate 10, which was heated to 600° C. and rotated 120 times per minute;
- closing valves 23 and 29;
- opening valves 19, 20, 21, 25, 26 and 27 to introduce vaporized barium dipivaloylmethane, strontium dipivaloylmethane and titanium tetraisopropoxy along with argon carrier gas, which entered into carburetors 13, 14 and 15 at 25 SCCM, 25 SCCM and 5 SCCM respectively, into reaction chamber 6;
- reacting the gas with oxygen, which entered in the chamber at a 10 SCCM flow rate, with 1.4 W/cm$^2$ electric power plasma at 7 Pa for 16 minutes in the chamber, thus forming a 2 μm thick Ba$_{1-x}$Sr$_x$TiO$_3$ layer on the surface of the NiO layer (Ba$_{1-x}$Sr$_x$TiO$_3$/NiO); and
- forming a 100 nm thick counter-electrode (platinum layer) on the Ba$_{1-x}$Sr$_x$TiO$_3$/NiO by a sputtering method with 50 W plasma power, at 600° C. substrate temperature and gas pressure 1.5 Pa for 15 minutes.

As a result, a thin film capacitor (1-a) was manufactured.

As a comparison, another thin film capacitor (1-b) was manufactured by forming a Ba$_{1-x}$Sr$_x$TiO$_3$ layer directly on a platinum layer, which was formed on a Si substrate by a plasma-enhanced CVD method, and then a counter-electrode (platinum) by a sputtering method.

The film compositions of thin film capacitors (1-a) and (1-b) were analyzed with an electron probe X-ray microanalyzer. According to the analyses, the dielectric layers of these capacitors were Ba$_{0.7}$Sr$_{0.3}$TiO$_3$.

The dielectric constant and dielectric loss (1 kHz, 1 V) of thin film capacitor (1-a) at room temperature measured by a LCR (inductance-capacitance-resistance) meter were 4,200 and 1.4%. Thin film capacitor (1-b), on the other hand, had a 2,800 dielectric constant and 1.8% dielectric loss. The insulation resistance of these capacitors was higher than 10$^9$Ω.cm. Thin film capacitor (1-a) had 1.8 MV/cm direct current breakdown voltage while the capacitor (1-b) had 1.4 MV/cm.

A NiO layer, a Ba$_{0.7}$Sr$_{0.3}$TiO$_3$ layer, and a Ba$_{0.7}$Sr$_{0.3}$TiO$_3$/NiO film were individually formed on Si substrates. The crystal structures and the crystal orientations of the layers and the film were analyzed by reflection high-energy electron diffraction (RHEED) and X-ray diffraction. According to the analyses, the NiO layer was oriented to (100) face. The Ba$_{0.7}$Sr$_{0.3}$TiO$_3$ layer formed on the oriented NiO layer (Ba$_{0.7}$Sr$_{0.3}$TiO$_3$ layer of the Ba$_{0.7}$Sr$_{0.3}$TiO$_3$/NiO film) showed stronger (100) orientation and higher crystallinity than the Ba$_{0.7}$Sr$_{0.3}$TiO$_3$ layer formed directly on the substrate.

The cross section and the surface of the Ba$_{0.7}$Sr$_{0.3}$TiO$_3$/NiO film were observed with a high resolution scanning electron microscope. According to the observation, the Ba$_{0.7}$Sr$_{0.3}$TiO$_3$ layer of the film was significantly dense, and its particle size was about 0.20 μm.

Experiments were conducted by using not only Ni oxide layers but also a Co oxide layer or a Mg oxide layer as a NaCl oxide layer, and applying Ba$_{1-x}$Sr$_x$TiO$_3$ layers of different compositions or a Pb{Mg$_⅓$, Nb$_⅔$}$_{1-Y}$Ti$_Y$O$_3$ layer as a dielectric thin film. As clearly shown in the following Table 1, thin film capacitors having dielectric thin layers formed on NaCl oxide layers had better characteristics than the ones having dielectric thin layers formed directly on electrodes.

TABLE 1

| TFC* | NaCl Oxide Layer composition | ** | Perovskite Dielectric Layer composition | ** |
|---|---|---|---|---|
| 1-a | NiO | 20 | Ba$_{0.7}$Sr$_{0.3}$TiO$_3$ | 2.0 |
| 1-b | — | — | Ba$_{0.7}$Sr$_{0.3}$TiO$_3$ | 2.0 |
| 1-c | Li$_{0.2}$Ni$_{0.8}$O | 50 | BaTiO$_3$ | 0.4 |
| 1-d | — | — | BaTiO$_3$ | 0.4 |
| 1-e | CoO | 40 | SrTiO$_3$ | 1.7 |
| 1-f | — | — | SrTiO$_3$ | 1.7 |
| 1-g | Li$_{0.3}$Co$_{0.7}$O | 100 | Ba$_{0.5}$Sr$_{0.5}$TiO$_3$ | 4.0 |
| 1-h | — | — | Ba$_{0.5}$Sr$_{0.5}$TiO$_3$ | 4.0 |
| 1-i | MgO | 15 | Ba$_{0.2}$Sr$_{0.8}$TiO$_3$ | 2.3 |
| 1-j | — | — | Ba$_{0.2}$Sr$_{0.8}$TiO$_3$ | 2.3 |
| 1-k | Li$_{0.2}$Ni$_{0.8}$O | 60 | Pb(Mg$_⅓$,Nb$_⅔$)$_{0.3}$Ti$_{0.7}$O$_3$ | 1.0 |
| 1-l | — | — | Pb(Mg$_⅓$,Nb$_⅔$)$_{0.3}$Ti$_{0.7}$O$_3$ | 1.0 |
| 1-m | Li$_{0.2}$Ni$_{0.8}$O | 150 | PbTiO$_3$ | 3.2 |
| 1-n | — | — | PbTiO$_3$ | 3.2 |
| 1-o | NiO | 30 | Pb(Mg$_⅓$,Nb$_⅔$)O$_3$ | 2.6 |
| 1-p | — | — | Pb(Mg$_⅓$,Nb$_⅔$)O$_3$ | 2.6 |
| 1-q | Li$_{0.4}$Ni$_{0.6}$O | 90 | Pb(Mf$_⅓$,Nb$_⅔$)$_{0.5}$Ti$_{0.5}$O$_3$ | 0.5 |
| 1-r | — | — | Pb(Mf$_⅓$,Nb$_⅔$)$_{0.5}$Ti$_{0.5}$O$_3$ | 0.5 |
| 1-s | Li$_{0.1}$Ni$_{0.8}$O | 80 | Pb(Mg$_⅓$,Nb$_⅔$)$_{0.8}$Ti$_{0.2}$O$_3$ | 1.8 |
| 1-t | — | — | Pb(Mg$_⅓$,Nb$_⅔$)$_{0.8}$Ti$_{0.2}$O$_3$ | 1.8 |

| | Electric Characteristics of Thin Film Capacitor | | |
|---|---|---|---|
| TFC* | Dielectric Constant | tanσ (%) | DCBV*** |
| 1-a | 4,200 | 1.4 | 1.8 |
| 1-b | 2,800 | 1.8 | 1.4 |
| 1-c | 1,800 | 2.0 | 1.5 |
| 1-d | 1,400 | 2.8 | 1.0 |
| 1-e | 360 | 1.8 | 2.0 |

TABLE 1-continued

| | | | |
|---|---|---|---|
| 1-f | 300 | 2.5 | 1.7 |
| 1-g | 3,700 | 1.5 | 2.0 |
| 1-h | 3,200 | 1.8 | 2.0 |
| 1-i | 1,400 | 1.8 | 1.7 |
| 1-j | 1,100 | 1.9 | 1.5 |
| 1-k | 10,500 | 2.2 | 1.4 |
| 1-l | 8,800 | 3.6 | 1.0 |
| 1-m | 320 | 1.5 | 1.5 |
| 1-n | 170 | 2.8 | 1.2 |
| 1-o | 9,900 | 2.0 | 1.4 |
| 1-p | 8,600 | 2.4 | 1.3 |
| 1-q | 7,600 | 2.2 | 1.4 |
| 1-r | 7,000 | 2.3 | 1.2 |
| 1-s | 12,000 | 2.1 | 1.5 |
| 1-t | 11,000 | 2.3 | 1.4 |

*Thin Film Capacitor
**Thickness (nm)
***Direct Current Breakdown Voltage (MV/cm)

$\beta$-diketone metal complex was used as a source material for a NaCl oxide layer. In order to form a perovskite dielectric thin layer, Ba(DPM), Sr(DPM)$_2$, Ti(C$_3$H$_7$O)$_4$ or Ti(DPM)$_2$, (C$_3$H$_7$O)$_2$, Pb(DPM)$_2$ or Pb(C$_2$H$_5$)$_4$, Mg(DPM)$_2$ or Mg(acac)$_2$, and Nb(C$_2$H$_5$O)$_5$ or Nb(DPM)$_2$·Cl$_3$ were used.

Besides Pt, nickel, palladium, silver/palladium alloy, copper or the like can be used for a metal electrode. The characteristics of a thin film capacitor are the same with any of the methods including a sputtering method, vacuum deposition method, CVD method and plasma-enhanced CVD method.

Example 2

Figure 3:
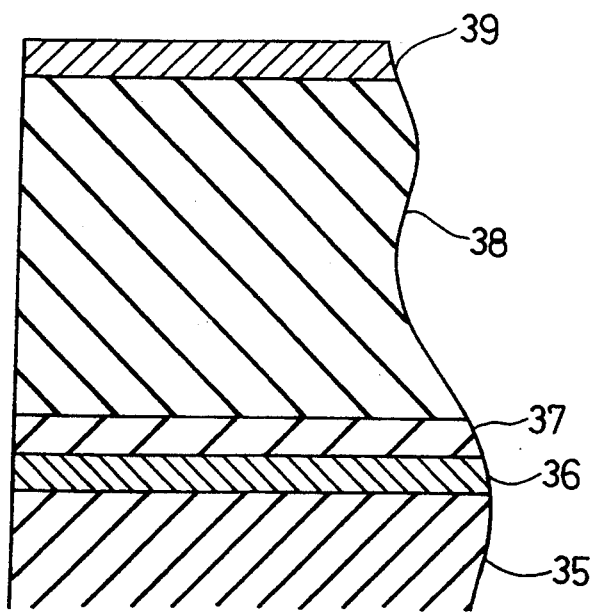
FIG. 3 shows a cross-sectional view of a thin film capacitor of one embodiment of the invention.

FIG. 3 shows a thin film capacitor of this example having a platinum layer 36 (metal electrode), a Ni$_{0.5}$Fe$_{2.5}$O$_4$ layer 37 (spinel oxide thin layer oriented to (100) face), a Ba$_{0.8}$Sr$_{0.2}$TiO$_3$ layer 38 (perovskite dielectric thin layer oriented to (100) face) and a platinum layer 39 (metal electrode) sequentially laminated on the surface of a Si substrate 35.

More specifically, the thin film capacitor of this example was manufactured as follows.

A 100 nm thick Pt layer was formed on Si substrate 35 by a sputtering treatment with a rf magnetron sputtering apparatus at 50 W plasma power, 600° C. substrate temperature and 1.4 Pa gas pressure for 14 minutes. Then, Si substrate 35 formed with the Pt layer (Pt layer/Si substrate) was attached to the bottom surface of electrode 7 shown in FIG. 2, and heated to 600° C. A NaCl oxide thin layer and a perovskite dielectric body thin layer were formed on the surface of Pt layer/Si substrate as follows:

inserting dehydrated nickel acethyl acetate, {Ni(acac)$_2$·H$_2$O, acac=C$_5$H$_7$O$_2$}, into a carburetor 17 and heating it to 160° C.;

inserting iron acethyl acetate, {Fe(acac)$_3$}, into a carburetor 18 and heating it to 130° C.;

inserting barium dipivaloylmethane, {Ba(DPM)$_2$, DPM=C$_{11}$H$_{19}$O$_2$}, into carburetor 13 and heating it to 235° C.;

inserting strontium dipivaloylmethane, {Sr(DPM)$_2$}, into carburetor 14 and heating it to 235° C.;

inserting titanium tetraisopropoxy, {Ti(C$_3$H$_7$O)$_4$}, into carburetor 15 and heating it to 40° C.;

opening valves 23, 24, 29 and 30 to introduce nickel acethyl acetate and iron acethyl acetate along with argon carrier gas, which entered into carburetors 17 and 18 at 20 and 30 SCCM flow rates respectively, to reaction chamber 6;

reacting vaporized nickel acethyl acetate and iron acethyl acetate with oxygen, which entered into reaction chamber 6 at a 15 SCCM flow rate, in the chamber depressurized by exhaust system 11;

carrying out the reaction with a 1.4 W/cm$^2$ electric power plasma at 5 Pa for two minutes, thus forming a 50 nm thick Ni$_X$Fe$_{1-X}$O$_4$ layer ($0 \leq X \leq 1.0$) on the substrate, which was heated to 550° C. and rotated 120 times per minute;

closing valves 23, 24, 29 and 30;

opening valves 19, 20, 21, 25, 26 and 27 to introduce vaporized barium dipivaloylmethane, strontium dipivaloylmethane and titanium tetraisopropoxy to reaction chamber 8 by argon carrier gas flowing into carburetors 13, 14 and 15 at 25, 30 and 5 SCCM flow rates respectively;

reacting the materials with oxygen of a 10 SCCM flow rate in reaction chamber 6 by a 1.4 W/cm$^2$ electric power plasma at 7 Pa for 15 minutes, thus forming a 1.6 $\mu$m thick Ba$_{1-X}$Sr$_X$TiO$_3$ layer on the surface of the Ni$_X$Fe$_{3-X}$O$_4$ layer (Ba$_{1-X}$Sr$_X$TiO$_3$/Ni$_X$Fe$_{3-X}$O$_4$ film);

taking the substrate formed with the Ba$_{1-X}$Sr$_X$TiO$_3$/Ni$_X$Fe$_{3-X}$O$_4$ film out of the reaction vacuum chamber; and forming a 100 nm thick counter-electrode (platinum layer) on the substrate by a sputtering method at 60 W plasma power, 550° C. substrate temperature and 2 Pa gas pressure for 15 minutes, thus manufacturing a thin film capacitor (2-a).

On the surface of a platinum layer formed on a Si substrate, a Ba$_{1-X}$Sr$_X$TiO$_3$ layer was formed directly by a plasma-enhanced CVD method, and a counter-electrode (platinum) was formed on the Ba$_{1-X}$Sr$_X$TiO$_3$ layer by a sputtering method. As a result, a thin film capacitor (2-b) was manufactured.

The film compositions of thin film capacitors (2-a) and (2-b) were analyzed with an electron probe X-ray microanalyzer. According to the analyses, the foundation layer of the capacitor (2-a) was Ni$_{0.5}$Fe$_{2.5}$O$_4$, and the dielectric layers of capacitors (2-a) and (2-b) were Ba$_{0.8}$Sr$_{0.2}$TiO$_3$.

The dielectric constant and the dielectric loss (1 kHz, 1 V) of the capacitor (2-a) at room temperature measured by a LCR meter were 3,100 and 2.0% while those of the capacitor (2-b) were 2,800 and 2.9%. The insulation resistance of the capacitors (2-a) and (2-b) was above $10^9 \Omega$·cm. The direct current breakdown voltage of the capacitor (2-a) was 1.7 MV/cm while that of the capacitor (2-b) was 1.2 MV/cm.

A platinum layer, a Ni$_{0.5}$Fe$_{2.5}$O$_4$ layer, a Ba$_{0.8}$Sr$_{0.2}$TiO$_3$ layer, and a Ba$_{0.8}$Sr$_{0.2}$TiO$_3$/Ni$_{0.5}$Fe$_{2.5}$O$_4$ film were individually formed on Si substrates. Then, the crystal structures and the crystal orientations of the layers and the film were observed by RHEED and X-ray diffraction. According to the observation, the Ni$_{0.5}$Fe$_{2.5}$O$_4$ layer was oriented to (100) face. The Ba$_{0.8}$Sr$_{0.2}$TiO$_3$ layer formed on the oriented Ni$_{0.5}$Fe$_{2.5}$O$_4$ layer (Ba$_{0.8}$Sr$_{0.2}$TiO$_3$ layer of the Ba$_{0.8}$Sr$_{0.2}$TiO$_3$/Ni$_{0.5}$Fe$_{2.5}$O$_4$ film) had better (100) orientation and crystallinity than the Ba$_{0.8}$Sr$_{0.2}$TiO$_3$ layer directly formed on the substrate.

The cross section and the surface of the Ba$_{0.8}$Sr$_{0.2}$TiO$_3$/Ni$_{0.5}$Fe$_{2.5}$O$_4$ film were observed by a high resolution scanning electron microscope. According to the observation, the Ba$_{0.8}$Sr$_{0.2}$TiO$_3$ layer of the film was significantly dense, and the particle size was about 0.22 $\mu$m.

As shown in the following Table 2, thin film capacitors having dielectric thin layers formed on spinel oxide layers (foundation layers) showed better capacitor characteristics than the capacitors having dielectric thin layers formed directly on the electrodes.

TABLE 2

| TFC* | Spinel Oxide Layer composition | ** | Perovskite Dielectric Layer composition | ** |
|---|---|---|---|---|
| 2-a | $Ni_{0.5}Fe_{2.5}O_4$ | 50 | $Ba_{0.8}Sr_{0.2}TiO_3$ | 1.6 |
| 2-b | — | — | $Ba_{0.8}Sr_{0.2}TiO_3$ | 1.6 |
| 2-c | $Zn_{0.2}Fe_{2.8}O_4$ | 60 | $Ba_{0.3}Sr_{0.7}TiO_3$ | 4.0 |
| 2-d | — | — | $Ba_{0.3}Sr_{0.7}TiO_3$ | 4.0 |
| 2-e | $Co_{0.4}Fe_{2.6}O_4$ | 50 | $BaTiO_3$ | 2.3 |
| 2-f | — | — | $BaTiO_3$ | 2.3 |
| 2-g | $Co_3O_4$ | 40 | $SrTiO_3$ | 0.6 |
| 2-h | — | — | $SrTiO_3$ | 4.0 |
| 2-i | $MgAl_2O_4$ | 40 | $PbTiO_3$ | 1.8 |
| 2-j | — | — | $PbTiO_3$ | 1.8 |
| 2-k | $Mn_{0.3}Fe_{2.7}O_4$ | 70 | $Pb(Mg_{\frac{1}{3}},Nb_{\frac{2}{3}})O_3$ | 2.0 |
| 2-l | — | — | $Pb(Mg_{\frac{1}{3}},Nb_{\frac{2}{3}})O_3$ | 2.0 |
| 2-m | $Co_3O_4$ | 30 | $Pb(Mg_{\frac{1}{3}},Nb_{\frac{2}{3}})_{0.2}Ti_{0.8}O_3$ | 0.4 |
| 2-n | — | — | $Pb(Mg_{\frac{1}{3}},Nb_{\frac{2}{3}})_{0.2}Ti_{0.8}O_3$ | 0.4 |

| TFC* | Electric Characteristics of Thin Film Capacitor | | |
|---|---|---|---|
| | Dielectric Constant | tanσ (%) | DCBV*** |
| 2-a | 3,100 | 2.0 | 1.7 |
| 2-b | 2,800 | 2.9 | 1.2 |
| 2-c | 1,500 | 1.9 | 1.9 |
| 2-d | 1,200 | 3.0 | 1.4 |
| 2-e | 1,900 | 2.4 | 1.5 |
| 2-f | 1,600 | 3.6 | 1.4 |
| 2-g | 320 | 1.4 | 1.9 |
| 2-h | 190 | 2.0 | 1.4 |
| 2-i | 280 | 2.1 | 1.4 |
| 2-j | 200 | 2.8 | 1.0 |
| 2-k | 9,200 | 3.0 | 1.2 |
| 2-l | 8,000 | 4.5 | 0.7 |
| 2-m | 12,000 | 2.6 | 1.1 |
| 2-n | 9,500 | 3.7 | 0.8 |

*Thin Film Capacitor
**Thickness (nm)
***Direct Current Breakdown Voltage (MV/cm)

β-diketone metal complex was used as a source material for a spinel oxide layer. A perovskite dielectric layer was formed by using $Ba(DPM)_2$, $Sr(DPM)_2$, $Ti(C_3H_7O)_4$ or $Ti(DPM)_2 \cdot (C_3H_7O)_2$, $Pb(DPM)_2$ or $Pb(C_2H_5)_4$, $Mg(DPM)_2$ or $Mg(acac)_2$ and $Nb(C_2H_5O)_5$ or $Nb(DPM)_2 \cdot Cl_3$.

In addition to Pt, other metals such as nickel, palladium, silver/palladium alloy, copper or the like can be used as a metal electrode. The properties of thin film capacitors are the same with any of these methods including a sputtering method, a vacuum deposition method, a CVD method, and a plasma-enhanced CVD method.

Example 3

Figure 4:
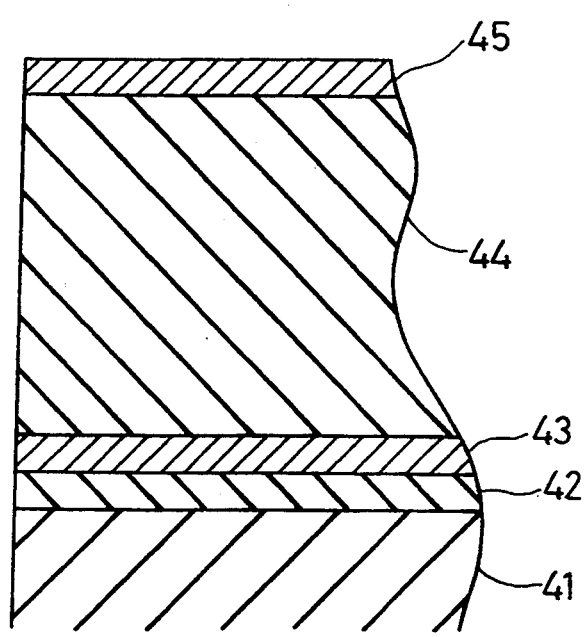
FIG. 4 shows a cross-sectional view of a thin film capacitor of one embodiment of the invention.

FIG. 4 shows a thin film capacitor of this example having a NiO layer 42 (NaCl oxide thin layer oriented to (100) face), a platinum layer 43 (metal electrode), a $Ba_{0.5}Sr_{0.5}TiO_3$ layer 44 (perovskite dielectric thin layer oriented to (100) face) and a platinum layer 45 (metal electrode) sequentially laminated on a Si substrate 41.

More specifically, the thin film capacitor of this example were manufactured as follows.

Dehydrated nickel acethyl acetate, barium dipivaloylmethane, strontium dipivaloylmethane, and titanium tetraisopropoxy were inserted into carburetors 17, 13, 14 and 15 shown in FIG. 2, and heated to 160° C., 235° C., 240° C. and 40° C. respectively. After opening valves 23 and 29, vaporized nickel acethyl acetate along with argon carrier gas having a 20 SCCM flow rate and oxygen having a 10 SCCM flow rate entered into reaction chamber 6 depressurized by exhaust system 11. Reaction was carried out in the chamber with 1.4 W/cm² electric power plasma, at 5 Pa for three minutes. As a result, a 60 nm thick NiO layer was formed on substrate 10, which was heated to 600° C. and rotated 120 times per minute. Then, valves 23 and 29 were closed. After cooling the NiO layer/Si substrate to room temperature, it was removed from the chamber. Due to a sputtering treatment with a rf magnetron sputtering apparatus at 40 W plasma, 1.0 Pa gas pressure and 600° C. substrate temperature for 20 minutes, a 80 nm thick platinum thin layer was formed on the surface of the NiO layer (Pt layer/NiO layer/Si substrate).

The Pt layer/NiO layer/Si substrate was taken out of the sputtering apparatus after being cooled to room temperature. Then, it was fixed to the bottom surface of electrode 7 of the plasma-enhanced CVD device shown in FIG. 2. The pressure inside the reaction chamber was reduced by exhaust system 11, and the Pt layer/NiO layer/Si substrate was heated to 600° C. in the chamber. After opening valves 19, 20, 21, 25, 26 and 27, vaporized barium dipivaloylmethane, strontium dipivaloylmethane and titanium tetraisopropoxy were introduced to the reaction chamber by argon carrier gas, which entered carburetors 13, 14 and 15 at 25 SCCM, 3 30 SCCM and 5 SCCM flow rates respectively. Oxygen was also introduced to reaction chamber 6 at a 10 SCCM flow rate, thus generating reaction with 1.4 W/cm² electric power plasma at 7 Pa for 15 minutes in the chamber. As a result, a 2.2 μm thick $Ba_{1-x}Sr_xTiO_3$ layer was formed on the surface of the Pt layer. The Si substrate formed with the $Ba_{1-x}Sr_xTiO_3/Pt/NiO$ film was removed from the vacuum reaction chamber, and a 100 nm thick counter-electrode (platinum layer) was formed on the surface of the Si substrate by a sputtering treatment at 50 W plasma power, 1.4 Pa gas pressure and 600° C. substrate temperature for 15 minutes. As a result, a thin film capacitor (3-a) was manufactured.

A Pt layer was directly formed on a Si substrate by a sputtering method without forming a NiO layer between the Pt layer and the substrate. Then, a $Ba_{1-x}Sr_xTiO_3$ layer was formed on the Pt layer by a plasma-enhanced CVD method, and a counter-electrode (platinum) was formed on the $Ba_{1-x}Sr_xTiO_3$ layer by a sputtering method. Thus, a thin film capacitor (3-b) was manufactured.

According to an electron probe X-ray microanalysis (EPMA), the compositions of dielectric layers of the capacitors (3-a) and (3-b) were $Ba_{0.5}Sr_{0.5}TiO_3$. The dielectric constant and the dielectric loss (1 kHz, 1 V) of the capacitor (3-a) at room temperature were 4,000 and 1.7% respectively by a LCR meter, and those of the capacitor (3-b) were 2,100 and 1.8%. The insulation resistance of the capacitors (3-a) and (3-b) was above $10^9 \Omega \cdot cm$. The direct current breakdown voltage of the capacitor (3-a) was 1.8 V/cm while that of the capacitor (3-b) was 1.5 MV/cm.

A NiO layer, a Pt layer, a Pt/NiO film, a $Ba_{0.5}Sr_{0.5}TiO_3$ layer, and a $Ba_{0.5}Sr_{0.5}TiO_3/Pt/NiO$ film were individually formed on Si substrates. The crystal compositions and the crystal orientations of the layers and the film were observed by RHEED and X-ray diffraction. According to the observation, it was found that the NiO layer was oriented to (100) face. The Pt layer, on the other hand, showed no orientation. The Pt layer of the Pt/NiO film was oriented to (100) face. The $Ba_{0.5}Sr_{0.5}TiO_3$ layer formed on the oriented Pt layer ($Ba_{0.5}Sr_{0.5}TiO_3$ layer of the $Ba_{0.5}Sr_{0.5}TiO_3$/Pt/NiO film) showed a stronger (100) orientation property and crystallinity than the $Ba_{0.5}Sr_{0.5}TiO_3$ layer directly formed on the substrate.

The cross section and the surface of the $Ba_{0.5}Sr_{0.5}TiO_3$/Pt/NiO film were observed with a high resolution scanning electron microscope. According to the observation, the $Ba_{0.5}Sr_{0.5}TiO_3$ layer of the film was highly dense, and the particle size was about 0.2 $\mu m$.

As shown in the following Table 3, thin film capacitors having dielectric thin layers formed on NaCl oxide layers (foundation layers) showed better characteristics than the capacitors having dielectric thin layers formed directly on the electrodes.

TABLE 3

| TFC* | NaCl Oxide Layer composition | ** | Perovskite Dielectric Layer composition | ** |
|---|---|---|---|---|
| 3-a | NiO | 60 | $Ba_{0.5}Sr_{0.5}TiO_3$ | 2.2 |
| 3-b | — | — | $Ba_{0.5}Sr_{0.5}TiO_3$ | 2.2 |
| 3-c | CoO | 300 | $Ba_{0.9}Sr_{0.1}TiO_3$ | 0.5 |
| 3-d | — | — | $Ba_{0.9}Sr_{0.1}TiO_3$ | 0.5 |
| 3-e | NiO | 20 | $Ba_{0.2}Sr_{0.8}TiO_3$ | 2.0 |
| 3-f | — | — | $Ba_{0.2}Sr_{0.8}TiO_3$ | 2.0 |
| 3-g | $Li_{0.4}Ni_{0.6}O$ | 100 | $BaTiO_3$ | 3.3 |
| 3-h | — | — | $BaTiO_3$ | 3.3 |
| 3-i | $Li_{0.2}Ni_{0.8}O$ | 90 | $SrTiO_3$ | 1.8 |
| 3-j | — | — | $SrTiO_3$ | 1.8 |
| 3-k | MgO | 100 | $Pb(Mg_{\frac{1}{3}},Nb_{\frac{2}{3}})_{0.3}Ti_{0.7}O_3$ | 2.1 |
| 3-l | — | — | $Pb(Mg_{\frac{1}{3}},Nb_{\frac{2}{3}})_{0.3}Ti_{0.7}O_3$ | 2.1 |
| 3-m | $Li_{0.2}Co_{0.8}O$ | 400 | $PbTiO_3$ | 2.0 |
| 3-n | — | — | $PbTiO_3$ | 2.0 |
| 3-o | MgO | 40 | $Pb(Mg_{\frac{1}{3}},Nb_{\frac{2}{3}})O_3$ | 2.2 |
| 3-p | — | — | $Pb(Mg_{\frac{1}{3}},Nb_{\frac{2}{3}})O_3$ | 2.2 |
| 3-q | MgO | 60 | $Pb(Mg_{\frac{1}{3}},Nb_{\frac{2}{3}})_{0.6}Ti_{0.4}O_3$ | 0.6 |
| 3-r | — | — | $Pb(Mg_{\frac{1}{3}},N_{\frac{2}{3}})_{0.6}Ti_{0.4}O_3$ | 0.6 |

| TFC* | Electric Characteristics of Thin Film Capacitor | | |
|---|---|---|---|
| | Dielectric Constant | tan$\sigma$ (%) | DCBV*** |
| 3-a | 4,000 | 1.7 | 1.8 |
| 3-b | 2,100 | 1.8 | 1.5 |
| 3-c | 2,700 | 1.9 | 1.5 |
| 3-d | 1,600 | 3.0 | 0.9 |
| 3-e | 1,050 | 0.9 | 2.0 |
| 3-f | 720 | 2.4 | 1.4 |
| 3-g | 1,900 | 1.7 | 2.0 |
| 3-h | 1,450 | 1.9 | 1.7 |
| 3-i | 400 | 1.3 | 1.7 |
| 3-j | 320 | 2.0 | 1.5 |
| 3-k | 9,800 | 2.6 | 1.2 |
| 3-l | 7,900 | 3.8 | 0.9 |
| 3-m | 240 | 2.2 | 1.2 |
| 3-n | 230 | 3.4 | 1.1 |
| 3-o | 9,500 | 2.0 | 1.3 |
| 3-p | 9,000 | 3.0 | 0.9 |
| 3-q | 6,500 | 2.4 | 1.0 |
| 3-r | 4,700 | 4.5 | 0.6 |

*Thin Film Capacitor
**Thickness (nm)
***Direct Current Breakdown Voltage (MV/cm)

$\beta$-diketone metal complex was used as a source material for a NaCl oxide layer. A perovskite dielectric thin layer was formed by using $Ba(DPM)_2$, $Sr(DPM)_2$, $Ti(C_3H_7O)_4$ or $Ti(DPM)_{2'}(C_3H_7O)_2$, $Pb(DPM)_2$, or $Pb(C_2H_5)_4$, $Mg(DPM)_2$ or $Mg(acac)_2$ and $Nb(C_2H_5O)_5$ or $Nb(DPM)_{2'}Cl_3$.

Besides Pt, other metals such as nickel, palladium, silver/palladium alloy, copper or the like can be used for a metal electrode. The properties of thin film capacitors remain the same with any of methods including a sputtering method, a vacuum deposition method, a CVD method, and a plasma-enhanced CVD method.

Example 4

Figure 5:
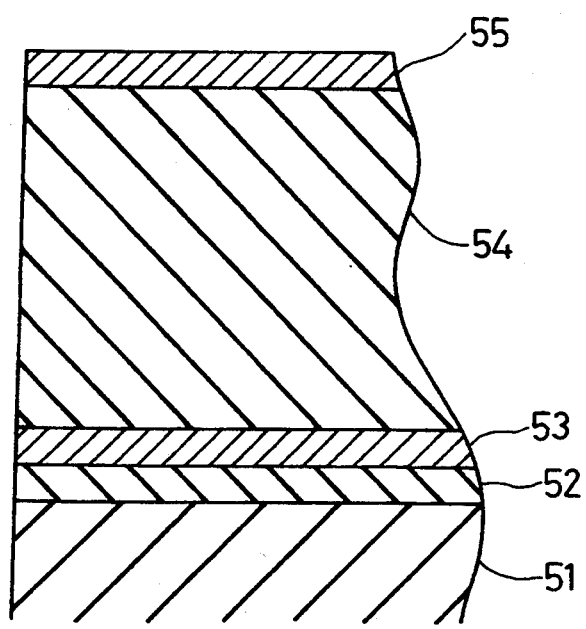
FIG. 5 shows a cross-sectional view of a thin film capacitor of one embodiment of the invention.

FIG. 5 shows a thin film capacitor of this example having a $Ni_{0.5}Fe_{2.5}O_4$ layer 52 (spinel oxide thin layer oriented to (100) face), a platinum layer 53 (metal electrode), a $Ba_{0.6}Sr_{0.4}TiO_3$ layer 54 (perovskite dielectric thin layer oriented to (100) face) and a platinum layer 55 (metal electrode) sequentially laminated on a Si substrate 51.

More specifically, the thin film capacitor was manufactured as follows.

Dehydrated nickel acethyl acetate {$Ni(acac)_2 \cdot H_2O$, $acac = C_5H_7O_2$}, iron acethyl acetate {$Fe(acac)_3$}, barium dipivaloylmethane {$Ba(DPM)_2$, $DPM = C_{11}H_{19}O_2$}, strontium dipivaloylmethane {$Sr(DPM)_2$} and titanium tetraisopropoxy {$Ti(C_3H_7O)_4$} were inserted into carburetors 17, 18, 13, 14 and 15 shown in FIG. 2, and heated to 160° C., 130° C., 235° C., 235° C. and 40° C. respectively. After opening valves 23, 24, 29 and 30, vaporized nickel acethyl acetate and iron acethyl acetate along with argon carrier gas, which entered carburetors 17 and 18 at 20 SCCM and 30 SCCM flow rates respectively, and oxygen at a 15 SCCM flow rate entered into reaction chamber 6. The reaction was carried out for four minutes in the chamber, depressurized to 5 Pa, with 1.4 W/cm$^2$ electric power plasma and at 550° C. substrate temperature. The substrate was also rotated 120 times per minute. As a result, a 90 nm thick $Ni_xFe_{3-x}O_4$ layer was formed on the substrate. Valves 23, 24, 29 and 30 were then closed.

After cooling the Si substrate formed with the $Ni_xFe_{3-x}O_4$ layer to room temperature, it was removed from the chamber. Due to a sputtering treatment with a rf magnetron sputtering apparatus at 40 W plasma power, 1.0 Pa gas pressure and 600° C. substrate temperature for 25 minutes, a 100 nm thick Pt layer was formed on the surface of the $Ni_xFe_{3-x}O_4$ layer.

The Si substrate formed with Pt/$Ni_xFe_{3-x}O_4$ film was taken out of the sputtering apparatus after being cooled to room temperature. Then, the substrate was fixed to the bottom surface of electrode 7 shown in FIG. 2. The pressure inside the reaction chamber was reduced by exhaust system 11, and the Si substrate was heated to 600° C. in the chamber. After opening valves 19, 20, 21, 25, 26 and 27, vaporized barium dipivaloylmethane, strontium dipivaloylmethane and titanium tetraisopropoxy were introduced to the reaction chamber by argon carrier gas, which entered carburetors 13, 14 and 15 at 25, 30 and 5 SCCM flow rates respectively. Oxygen was also introduced to reaction chamber 6 at a 10 SCCM flow rate, thus generating reaction at 1.4 W/cm$^2$ electric power plasma and 7 Pa for 15 minutes in the chamber. As a result, about a 1.9 $\mu m$ thick $Ba_{1-x}Sr_xTiO_3$ layer was formed on the surface of the Pt/$Ni_xFe_{3-x}O_4$ film. The Si substrate formed with the $Ba_{1-x}Sr_xTiO_3$/Pt/$Ni_xFe_{3-x}O_4$ film was taken out of the vacuum reaction chamber, and a 100 nm thick counterelectrode (platinum layer) was formed on the surface of the Si substrate by a sputtering treatment at 50 W plasma power, 1.4 Pa gas pressure and 600° C. substrate temperature for 15 minutes. As a result, a thin film capacitor (4-a) was manufactured.

A $Ba_{1-x}Sr_xTiO_3$ layer was directly formed on a Si substrate by a plasma-enhanced CVD method without forming a Pt/$Ni_xFe_{3-x}O_4$ layer in between. Then, a counter-electrode (platinum) was formed on the surface of the $Ba_{1-x}Sr_xTiO_3$ layer by a sputtering method at 50 W plasma power, 1.4 Pa gas pressure and 600° C. substrate temperature for 15 minutes. Thus, a thin film capacitor (4-b) was manufactured.

According to an EPMA, the compositions of dielectric layers of the capacitors (3-a) and (3-b) were $Ba_{0.6}Sr_{0.4}TiO_3$. The composition of the spinel oxide thin layer of the capacitor (4-a) was $Ni_{0.5}Fe_{2.5}O_4$.

The dielectric constant and the dielectric loss (1 kHz, 1 V) of the capacitor (4-a) at room temperature measured by a LCR meter were 4,100 and 1.8% and those of the capacitor (4-b) were 2,100 and 1.8%. The insulation resistance of the capacitors (4-a) and (4-b) was above $10^9 \Omega\cdot cm$. The direct current breakdown voltage of the capacitor (4-a) was 1.7 MV/cm while that of the capacitor (4-b) was 1.2 MV/cm.

A $Ni_{0.5}Fe_{2.5}O_4$ layer, a Pt layer, a $Ba_{0.6}Sr_{0.4}TiO_3$ layer and a $Ba_{0.6}Sr_{0.4}TiO_3/Pt/Ni_{0.5}Fe_{2.5}O_4$ film were individually formed on Si substrates. The crystal compositions and the crystal orientations of the layers and the film were observed by RHEED and X-ray diffraction. According to the observation, it was found that the $Ni_{0.5}Fe_{2.5}O_4$ layer was oriented to (100) face. The Pt layer showed no orientation. The $Ba_{0.6}Sr_{0.4}TiO_3$ layer formed on the $Pt/Ni_{0.5}Fe_{2.5}O_4$ film ($Ba_{0.6}Sr_{0.4}TiO_3$ layer of the $Ba_{0.6}Sr_{0.4}TiO_3/Pt/Ni_{0.5}Fe_{2.5}O_4$ film) showed higher (100) orientation and crystallinity than the $Ba_{0.6}Sr_{0.4}TiO_3$ layer directly formed on the substrate surface.

The cross section and the surface of the $Ba_{0.6}Sr_{0.4}TiO_3/Pt/Ni_{0.5}Fe_{2.5}O_4$ film were observed by a high resolution scanning electron microscope. According to the observation, the $Ba_{0.6}Sr_{0.4}TiO_3$ layer of the film was highly dense, and the particle size was about 0.22 μm.

As shown in the following Table 4, thin film capacitors having dielectric thin layers formed on spinel oxide layers (foundation layers) showed better characteristics than the capacitors having dielectric thin layers formed directly on the electrodes.

TABLE 4

| TFC* | Spinel Oxide Layers composition | ** | (a) ** | Perovskite Dielectric Layer composition | ** |
|---|---|---|---|---|---|
| 4-a | $Ni_{0.5}Fe_{2.5}O_4$ | 90 | 100 | $Ba_{0.6}Sr_{0.4}TiO_3$ | 1.9 |
| 4-b | — | — | 100 | $Ba_{0.6}Sr_{0.4}TiO_3$ | 1.9 |
| 4-c | $Co_3O_4$ | 150 | 70 | $BaTiO_3$ | 0.7 |
| 4-d | — | — | 70 | $BaTiO_3$ | 0.7 |
| 4-e | $MgAl_2O_4$ | 200 | 150 | $SrTiO_3$ | 2.0 |
| 4-f | — | — | 150 | $SrTiO_3$ | 2.0 |
| 4-g | $Zn_{0.1}Fe_{2.9}O_4$ | 120 | 80 | $Ba_{0.3}Sr_{0.7}TiO_3$ | 1.0 |
| 4-h | — | — | 80 | $Ba_{0.3}Sr_{0.7}TiO_3$ | 1.0 |
| 4-i | $Mn_{0.2}Fe_{2.8}O_4$ | 320 | 100 | $Pb(Mg_{1/3}Nb_{2/3})_{0.4}Ti_{0.6}O_3$ | 3.8 |
| 4-j | — | — | 100 | $Pb(Mg_{1/3}Nb_{2/3})_{0.4}Ti_{0.6}O_3$ | 3.8 |
| 4-k | $Co_{0.2}Fe_{2.8}O_4$ | 100 | 60 | $PbTiO_3$ | 1.8 |
| 4-l | — | — | 60 | $PbTiO_3$ | 1.8 |
| 4-m | $Co_3O_4$ | 160 | 50 | $Pb(Mg_{1/3}Nb_{2/3})O_3$ | 2.0 |
| 4-n | — | — | 50 | $Pb(Mg_{1/3}Nb_{2/3})O_3$ | 2.0 |

| | Electric Characteristics of Thin Film Capacitor | | |
|---|---|---|---|
| TFC* | Dielectric Constant | tanσ (%) | DCBV*** |
| 4-a | 4,100 | 1.8 | 1.7 |
| 4-b | 2,100 | 1.8 | 1.2 |
| 4-c | 1,600 | 2.0 | 1.6 |
| 4-d | 1,050 | 3.2 | 1.1 |
| 4-e | 360 | 1.3 | 1.9 |
| 4-f | 200 | 2.7 | 1.4 |
| 4-g | 1,200 | 2.5 | 1.7 |
| 4-h | 920 | 3.4 | 1.3 |
| 4-i | 8,400 | 2.4 | 1.6 |
| 4-j | 7,000 | 2.9 | 1.4 |
| 4-k | 290 | 2.0 | 1.5 |
| 4-l | 140 | 3.8 | 1.2 |
| 4-m | 1000 | 2.1 | 1.0 |

TABLE 4-continued

| 4-n | 7,600 | 4.5 | 0.7 |
|---|---|---|---|

*Thin Film Capacitor
**Thickness (nm)
***Direct Current Breakdown Voltage (MV/cm)
(a) Pt Layer β-diketone metal complex was used as a source material for a spinel oxide layer. A perovskite dielectric thin layer was formed by using $Ba(DPM)_2$, $Sr(DPM)_2$, $Ti(C_3H_7O)_4$ or $Ti(DPM)_2\cdot(C_3H_7O)_2$, $Pb(DPM)_2$ or $Pb(C_2H_5)_4$, $Mg(DPM)_2$ or $Mg(acac)_2$ and $Nb(C_2H_5O)_5$ or $Nb(DPM)_2\cdot Cl_3$.

In addition to Pt, other metals such as nickel, palladium, silver/palladium alloy, copper or the like can be used for a metal electrode. The properties of thin film capacitors are the same with any of the methods including a sputtering method, a vacuum deposition method, a CVD method, and a plasma-enhanced CVD method.

Example 5

Figure 6:
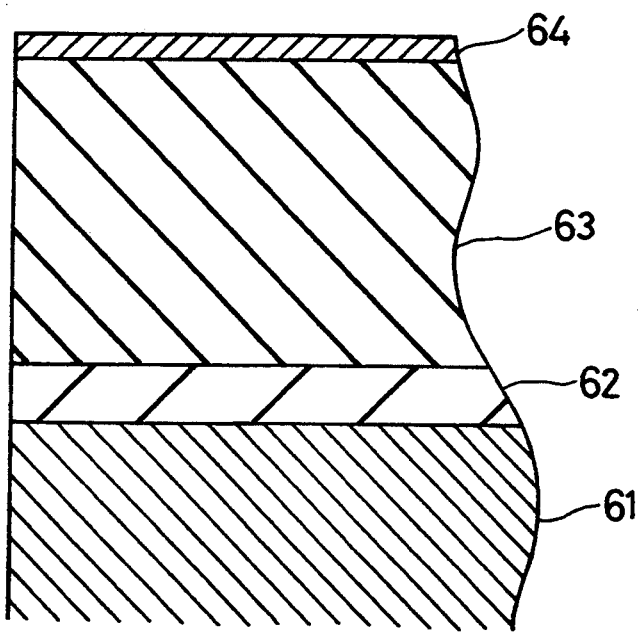
FIG. 6 shows a cross-sectional view of a thin film capacitor of one embodiment of the invention.

As shown in FIG. 6, a NiO layer 62 (NaCl oxide thin layer oriented to (100) face), a $Ba_{0.7}Sr_{0.3}TiO_3$ layer 63 (perovskite dielectric thin layer oriented to (100) face) and a platinum layer 64 (metal electrode) were sequentially laminated on the surface of a platinum substrate 61.

More specifically, the thin film capacitor of this example was manufactured as follows. A platinum substrate (Pt layer/Si substrate) was attached to the bottom surface of electrode 7 shown in FIG. 2, and heated to 600° C. A NaCl oxide thin layer and a perovskite dielectric thin layer were formed on the surface of the Pt layer/Si substrate as follows:

inserting dehydrated nickel acetyl acetate, {Ni(acac)$_2\cdot$H$_2$O, acac=$C_5H_7O_2$}, into a carburetor 17 and heating it to 160° C.;

inserting barium dipivaloylmethane, {Ba(DPM)$_2$, DPM=$C_{11}H_{19}O_2$}, into carburetor 13 and heating it to 235° C.;

inserting strontium dipivaloylmethane, {Sr(DPM)$_2$}, into carburetor 14 and heating it to 240° C.;

inserting titanium tetraisopropoxy, {Ti(C$_3$H$_7$O)$_4$}, into carburetor 15 and heating it to 40° C.;

opening valves 23 and 29 to introduce vaporized nickel acetyl acetate along with argon carrier gas, which entered into carburetors 17 at a 20 SCCM flow rate, to reaction chamber 6;

reacting vaporized nickel acetyl acetate with oxygen, which entered into reaction chamber 6 at a 10 SCCM flow rate, in the chamber depressurized by exhaust system 11;

carrying out the reaction with a 1.4 W/cm$^2$ electric power plasma at 5 Pa for one minute, thus forming a 20 nm thick NiO layer on substrate 10, which was heated to 600° C. and rotated 120 times per minute;

closing valves 23 and 29;

opening valves 19, 20, 21, 25, 26 and 27 to introduce vaporized barium dipivaloylmethane, strontium dipivaloylmethane and titanium tetraisopropoxy to reaction chamber 6 by argon carrier gas flowing into carburetors 13, 14 and 15 at 25, 25 and 5 SCCM flow rates respectively;

reacting the materials with oxygen of a 10 SCCM flow rate in reaction chamber 6 by a 1.4 W/cm$^2$ electric power plasma at 7 Pa for 16 minutes, thus forming a 2 μm thick $Ba_{1-x}Sr_xTiO_3$ layer on the surface of the NiO layer ($Ba_{1-x}Sr_xTiO_3$/NiO film);

taking the substrate formed with the $Ba_{1-x}Sr_xTiO_3$/NiO film out of the reaction vacuum chamber; and forming a 100 nm thick counter electrode (platinum layer) on the substrate by a sputtering method at a 50 W plasma power, 600° C. substrate temperature and 1.5 Pa gas pressure for 15 minutes, thus manufacturing a thin film capacitor (6-a).

As a comparison, a $Ba_{1-x}Sr_xTiO_3$ layer was formed directly on a Si substrate by a plasma-enhanced CVD method, and a counter-electrode (platinum) was formed on the $Ba_{1-x}Sr_xTiO_3$ layer by a sputtering method. As a result, a thin film capacitor (6-b) was manufactured.

The film compositions of thin film capacitors (6-a) and (6-b) were analyzed with an electron probe X-ray microanalyzer. According to the analyses, the dielectric layers of capacitors (6-a) and (6-b) were $Ba_{0.7}Sr_{0.3}TiO_3$.

The dielectric constant and the dielectric loss (1 kHz, 1 V) of the capacitor (6-a) at room temperature measured by a LCR meter were 4,300 and 1.5% respectively while those of the capacitor (6-b) were 2,700 and 1.9%. The insulation resistance of the capacitors (6-a) and (6-b) was above $10^9 \Omega \cdot cm$. The direct current breakdown voltage of the capacitor (6-a) was 1.9 MV/cm while that of the capacitor (6-b) was 1.6 MV/cm.

A NiO layer, a $Ba_{0.7}Sr_{0.3}TiO_3$ layer and a $Ba_{0.7}Sr_{0.3}TiO_3$/NiO film were individually formed on platinum substrates. Then, the crystal structures and the crystal orientations of the layers and the film were observed by RHEED and X-ray diffraction. According to the observation, the NiO layer was oriented to (100) face. The $Ba_{0.7}Sr_{0.3}TiO_3$ layer formed on the oriented NiO layer ($Ba_{0.7}Sr_{0.3}TiO_3$ layer of the $Ba_{0.7}Sr_{0.3}TiO_3$/NiO film) had better (100) orientation and crystallinity than the $Ba_{0.7}Sr_{0.3}TiO_3$ layer directly formed on the substrate.

The cross section and the surface of the $Ba_{0.7}Sr_{0.3}TiO_3$/NiO film were observed with a high resolution scanning electron microscope. According to the observation, the $Ba_{0.7}Sr_{0.3}TiO_3$ layer of the film was significantly dense, and the particle size was about 0.20 μm.

As shown in the following Table 5, thin film capacitors having dielectric thin layers formed on NaCl oxide layers (foundation layers) showed better capacitor characteristics than the capacitors having dielectric thin layers formed directly on the electrodes.

TABLE 5

| TFC* | NaCl Oxide Layer composition | ** | Perovskite Dielectric Thin Layer composition | ** |
|---|---|---|---|---|
| 5-a | NiO | 20 | $Ba_{0.7}Sr_{0.3}TiO_3$ | 2.0 |
| 5-b | — | — | $Ba_{0.7}Sr_{0.3}TiO_3$ | 2.0 |
| 5-c | $Li_{0.3}Ni_{0.7}O$ | 50 | $Pb(Mg_{\frac{1}{3}},Nb_{\frac{2}{3}})_{0.3}Ti_{0.7}O_3$ | 1.0 |
| 5-d | — | — | $Pb(Mg_{\frac{1}{3}},Nb_{\frac{2}{3}})_{0.3}Ti_{0.7}O_3$ | 1.0 |
| 5-e | MgO | 15 | $BaTiO_3$ | 4.0 |
| 5-f | — | — | $BaTiO_3$ | 4.0 |
| 5-g | CoO | 30 | $SrTiO_3$ | 1.9 |
| 5-h | — | — | $SrTiO_3$ | 1.9 |
| 5-i | $Li_{0.1}Co_{0.9}O$ | 100 | $Ba_{0.5}Sr_{0.5}TiO_3$ | 0.5 |
| 5-j | — | — | $Ba_{0.5}Sr_{0.5}TiO_3$ | 0.5 |
| 5-k | $Co_3O_4$ | 40 | $Pb(Mg_{\frac{1}{3}},Nb_{\frac{2}{3}})_{0.2}Ti_{0.8}O_3$ | 0.5 |
| 5-l | — | — | $Pb(Mg_{\frac{1}{3}},Nb_{\frac{2}{3}})_{0.2}Ti_{0.8}O_3$ | 0.5 |
| 5-m | $Ni_{0.4}Fe_{2.6}O_4$ | 90 | $Ba_{0.3}Sr_{0.7}TiO_3$ | 1.0 |
| 5-n | — | — | $Ba_{0.3}Sr_{0.7}TiO_3$ | 1.0 |
| 5-o | $MgAl_2O_4$ | 25 | $PbTiO_3$ | 1.8 |
| 5-p | — | — | $PbTiO_3$ | 1.8 |
| 5-q | $Zn0.5Fe_{2.5}O_4$ | 150 | $Pb(Mg_{\frac{1}{3}},Nb_{\frac{2}{3}})O_3$ | 2.2 |
| 5-r | — | — | $Pb(Mg_{\frac{1}{3}},Nb_{\frac{2}{3}})O_3$ | 2.2 |
| 5-s | $Co_{0.2}Fe_{2.8}O_4$ | 60 | $Pb(Mg_{\frac{1}{3}},Nb_{\frac{2}{3}})_{0.8}Ti_{0.2}O_3$ | 1.8 |
| 5-t | — | — | $Pb(Mg_{\frac{1}{3}},Nb_{\frac{2}{3}})_{0.8}Ti_{0.2}O_3$ | 1.8 |

| | Electric Characteristics of Thin Film Capacitor | | |
|---|---|---|---|
| TFC* | Dielectric Constant | tanσ (%) | DCBV*** |
| 5-a | 4,300 | 1.5 | 1.9 |
| 5-b | 2,700 | 1.9 | 1.6 |
| 5-c | 10,000 | 2.1 | 1.4 |
| 5-d | 8,600 | 3.4 | 1.0 |
| 5-e | 1,900 | 2.0 | 1.5 |
| 5-f | 1,600 | 2.7 | 1.0 |
| 5-g | 370 | 1.8 | 2.1 |
| 5-h | 290 | 2.2 | 1.9 |
| 5-i | 3,500 | 1.8 | 2.0 |
| 5-j | 3,000 | 1.9 | 2.0 |
| 5-k | 11,000 | 2.5 | 1.0 |
| 5-l | 9,600 | 3.9 | 0.8 |
| 5-m | 12,000 | 2.4 | 1.7 |
| 5-n | 920 | 3.5 | 1.4 |
| 5-o | 290 | 2.1 | 1.7 |
| 5-p | 150 | 3.6 | 1.2 |
| 5-q | 100,000 | 2.0 | 1.1 |
| 5-r | 7,600 | 4.0 | 0.8 |
| 5-s | 11,000 | 2.1 | 1.4 |
| 5-t | 10,000 | 2.6 | 1.0 |

*Thin Film Capacitor
**Thickness (nm)
***Direct Current Breakdown Voltage (MV/cm)

β-diketone metal complex was used as a source material for a NaCl oxide layer and a spinel oxide layer. A perovskite dielectric layer was formed by using $Ba(DPM)_2$, $Sr(DPM)_2$, $Ti(C_3H_7O)_4$ or $Ti(DPM)_2 \cdot (C_3H_7O)_2$, $Pb(DPM)_2$ or $Pb(C_2H_5)_4$, $Mg(DPM)_2$ or $Mg(acac)_2$ and $Nb(C_2H_5O)_5$ or $Nb(DPM)_2 \cdot Cl_3$.

In addition to Pt, other metals such as nickel, palladium, silver/palladium alloy, copper or the like can be used as the metal electrode. The properties of thin film capacitors are the same with any of these methods including a sputtering method, a vacuum deposition method, a CVD method, and a plasma-enhanced CVD method.

Figure 7:
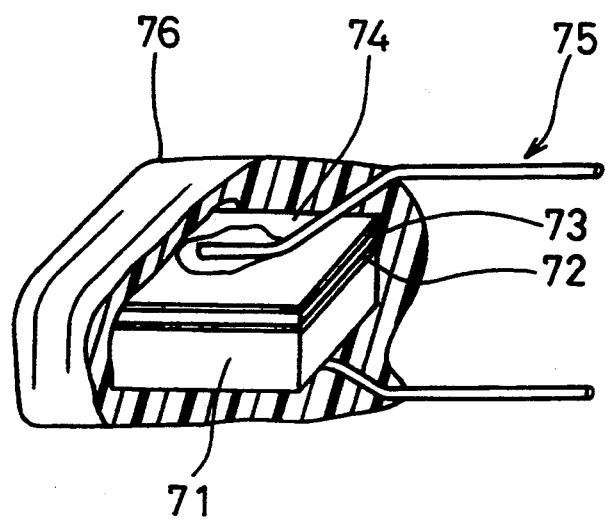
FIG. 7 shows a perspective view of a thin film capacitor of one embodiment of the invention.

FIG. 7 shows a perspective view of a thin film capacitor. This thin film capacitor was manufactured by the method of this example as described above. Then, the substrate was cut to 3.3 mm × 1.6 mm; metal cables 75 were soldered to the surface of each metal electrode; and epoxy resin 76 was molded over the entire surface. The capacity of this thin film capacitor was 100 pF. In FIG. 7, 71 indicates a metal electrode (platinum substrate); 72 shows a NaCl oxide thin layer or a spinel oxide thin layer; 73 is a perovskite dielectric thin layer; and 74 indicates a metal electrode (platinum layer).

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

We claim:

1. A thin film capacitor comprising a lower electrode directly or indirectly formed on a metal electrode substrate or a nonelectrode substrate, a dielectric thin layer directly or indirectly formed on said lower electrode and an upper electrode formed on said dielectric thin layer, wherein said dielectric thin layer is a perovskite dielectric thin layer oriented to (100) face, and wherein at least one layer selected from the group consisting of a NaCl oxide thin layer oriented to (100) face and a spinel oxide thin layer oriented to (100) face is formed below said dielectric thin layer.

2. A thin film capacitor according to claim 1, wherein the at least one layer selected from the group consisting of the NaCl oxide thin layer oriented to (100) face and the spinel oxide thin layer oriented to (100) face is formed between the lower electrode and the perovskite dielectric thin layer.

3. A thin film capacitor according to claim 1, wherein the perovskite dielectric thin layer is selected from the group consisting of $(Ba_{1-X}Sr_X)TiO_3$ where $0 \leq X \leq 1.0$ and $Pb\{(Mg_{\frac{1}{3}}, Nb_{\frac{2}{3}})_{1-Y}Ti_Y\}O_3$ where $0 \leq Y \leq 1.0$.

4. A thin film capacitor according to claim 1, wherein the NaCl oxide thin layer is at least one layer selected from the group consisting of a magnesium oxide thin layer, a cobalt oxide thin layer and a nickel oxide thin layer.

5. A thin film capacitor according to claim 1, wherein the spinel oxide thin layer mainly comprises at least one element selected from the group consisting of iron, cobalt and aluminum.

6. A thin film capacitor according to claim 1, wherein the lower electrode, the NaCl oxide thin layer oriented to (100) face, the perovskite dielectric thin layer oriented to (100) face and the upper electrode are sequentially laminated on the nonelectrode substrate.

7. A thin film capacitor according to claim 1, wherein the lower electrode, the spinel oxide thin layer oriented to (100) face, the NaCl oxide thin layer oriented to (100) face, the perovskite dielectric thin layer oriented to (100) face and the upper electrode are sequentially laminated on the nonelectrode substrate.

8. A thin film capacitor according to claim 1, wherein the NaCl oxide thin layer oriented to (100) face, the lower electrode, the perovskite dielectric thin layer oriented to (100) face and the upper electrode are sequentially laminated on the nonelectrode substrate.

9. A thin film capacitor according to claim 1, wherein the spinel oxide thin layer oriented to (100) face, the lower electrode, the perovskite dielectric thin layer oriented to (100) face and the upper electrode are sequentially laminated on the nonelectrode substrate.

10. A method of manufacturing a thin film capacitor comprising the steps of:

forming a lower electrode directly or indirectly on a metal substrate or a nonelectrode substrate by at least one method selected from the group consisting of a sputtering method, a vacuum deposition method, a CVD method and a plasma-enhanced CVD method;

forming a dielectric thin layer directly or indirectly on the surface of said lower electrode by a plasma-enhanced CVD method;

forming an upper electrode on the surface of said dielectric thin layer by at least one method selected from the group consisting of a sputtering method, a vacuum deposition method, a CVD method and a plasma-enhanced CVD method;

wherein at least one layer selected from the group consisting of a NaCl oxide thin layer oriented to (100) face and a spinel oxide thin layer oriented to (100) face is formed on the top or the bottom surface of said lower electrode by a plasma-enhanced CVD method, and wherein a perovskite dielectric thin layer oriented to (100) face is formed below the upper electrode by a plasma-enhanced CVD method.

11. A method according to claim 10, wherein at least one layer selected from the group consisting of the NaCl oxide thin layer oriented to (100) face and the spinel oxide thin layer oriented to (100) face is formed on the lower electrode by a plasma-enhanced CVD method, and wherein the perovskite dielectric thin layer is formed on said NaCl oxide thin layer or said spinel oxide thin layer.

12. A method according to claim 10, wherein the perovskite dielectric thin layer is selected from the group consisting of $(Ba_{1-X}Sr_X)TiO_3$ where $0 \leq X \leq 1.0$ and $Pb\{(Mg_{\frac{1}{3}}, Nb_{\frac{2}{3}})_{1-Y}Ti_Y\}O_3$ where $0 \leq Y \leq 1.0$.

13. A method according to claim 10, wherein the NaCl oxide thin layer is a layer selected from the group consisting of a magnesium oxide thin layer, a cobalt oxide thin layer and a nickel oxide thin layer.

14. A method according to claim 10, wherein the spinel oxide thin layer mainly comprises at least one element selected from the group consisting of iron, cobalt and aluminum.

* * * * *